United States Patent
Vanderstraeten

(10) Patent No.: US 6,461,686 B1
(45) Date of Patent: Oct. 8, 2002

(54) SPUTTERING TARGETS AND METHOD FOR THE PREPARATION THEREOF

(75) Inventor: Johan Emile Marie Vanderstraeten, Drongen (BE)

(73) Assignee: Bekaert VDS, Deinze (BE)

( * ) Notice: Subject to any disclaimer, the term of this patent is extended or adjusted under 35 U.S.C. 154(b) by 0 days.

(21) Appl. No.: 09/101,405

(22) PCT Filed: Jan. 3, 1997

(86) PCT No.: PCT/EP97/00020

§ 371 (c)(1),
(2), (4) Date: Jul. 14, 1999

(87) PCT Pub. No.: WO97/25451

PCT Pub. Date: Jul. 17, 1997

(30) Foreign Application Priority Data

Jan. 5, 1996 (GB) .............................................. 9600210

(51) Int. Cl.[7] ............................. C23C 4/10; B05D 3/00; C22C 14/00

(52) U.S. Cl. ................ 427/453; 427/398.1; 427/398.3; 420/417

(58) Field of Search ....................... 204/298.12, 298.13; 427/453, 398.1, 398.3; 420/417

(56) References Cited

U.S. PATENT DOCUMENTS

| | | | | |
|---|---|---|---|---|
| 4,422,917 A | * | 12/1983 | Hayfield ..................... | 204/196 |
| 5,354,446 A | * | 10/1994 | Kida et al. .............. | 204/298.22 |
| 5,618,388 A | * | 4/1997 | Seeser et al. ........... | 204/192.12 |
| 5,869,808 A | * | 2/1999 | Hyllberg ..................... | 219/216 |
| 6,193,856 B1 | * | 2/2001 | Kida et al. .............. | 204/192.22 |

FOREIGN PATENT DOCUMENTS

| | | | | |
|---|---|---|---|---|
| GB | 1438462 | * | 6/1976 | ........... C25B/11/04 |
| GB | 1595061 | * | 8/1981 | ............. B05D/5/12 |
| JP | 62-161945 | | 7/1987 | .............. C23C/4/10 |
| JP | 7-233469 | | 9/1995 | ........... C23C/14/34 |

OTHER PUBLICATIONS

WO 97/08359 abstract and untranslated document, Mar. 1997.*
JP 9–249967 abstract, Sep. 1997.*
JP 8–158048 abstract, Jun. 1996.*

* cited by examiner

Primary Examiner—Steven H. Ver Steeg
(74) Attorney, Agent, or Firm—Bacon & Thomas

(57) ABSTRACT

A process for the preparation of a sputtering target which comprises sub-stoichiometric titanium dioxide, $TiO_x$, where x is below 2 having an electrical resistivity of less than 0.5 ohm·cm, optionally together with niobium oxide, which process comprises plasma spraying titanium dioxide, $TiO_2$, optionally together with niobium oxide, onto a target base in an atmosphere which is oxygen deficient and which does not contain oxygen-containing compounds, the target base being coated with $TiO_x$, which is solidified by cooling under conditions which prevent the sub-stoichiometric titanium dioxide from combining with oxygen.

12 Claims, No Drawings

SPUTTERING TARGETS AND METHOD FOR THE PREPARATION THEREOF

The present application is the U.S. national phase of international application number PCT/EP97/00020.

The present invention relates to a process for the preparation of improved high rate sputtering targets and, in particular, to a process for the preparation of sputtering targets comprising sub-stoichiometric titanium dioxide with high electrical conductivity to be used in D.C. sputtering at high power levels.

Sputtered coatings of various oxides (e.g. silica) and nitrides (e.g. silicon nitride) are used to form optical coatings showing interesting properties on a number of substrates. Known applications include low emissivity films on window glasses, cold mirrors on reflectors, enhanced mirrors for photocopiers and antireflective coatings on picture glass or TV screens. These coatings are usually made of stacks of several different layers with different refractive indices, preferably a combination of low and high refractive index, to produce optical filters. For antireflective coatings it is preferred to combine two materials showing the highest and the lowest possible refractive indices. Such materials are titania and silica. Another advantage of these materials is their durability. For low emissivity films on window glasses it is preferred to combine a silver layer with a high refractive index material to dereflect the silver which improves light transmission.

Titanium dioxide coatings have a high refractive index and can thus be used to provide coatings of a high refractive index or to provide the high refractive index coatings in optical stacks. The existing process for producing titanium dioxide coatings comprises using titanium metal as the sputtering target and using oxygen as a component of the plasma gas. The titanium is thus converted to titanium dioxide during the sputtering process. Although satisfactory coatings of titanium dioxide can be produced, the rate of deposition is very slow and much slower than coating with zinc oxide and/or tin oxide.

As a substitute for titanium dioxide it has been suggested to use alternative materials such as niobium oxide. Whilst it is possible to coat a substrate with niobium oxide using a niobium metal target at slightly higher speeds than the equivalent process using titanium, niobium is very expensive.

JP-A-07-233469 describes the preparation of a sputtering target by hot-pressing titanium dioxide powder in a nonoxidizing atmosphere and sintering the compact. The sintered compact comprises $TiO_x$ where $1 < X < 2$ with a resistivity of 10 ohm·cm which is too high for D.C. sputtering at high power levels. The stability of the sputtering process and the arc rate are both very dependent upon the conductivity of the target, particularly at high power levels.

JP-A-62-161945 describes a method of manufacturing a ceramic sputtering target in which a ceramic material consisting mainly of $ZrO_2$, $TiO_2$, $SiO_2$, $Ta_2O_3$, $Al_2O_3$, $Fe_2O_3$ or a compound of these materials is sprayed using a water plasma spray to produce a formed body which may be used as a sputtering target. The sputtering target is used for high frequency sputtering of non-conductive target materials.

Accordingly, there is a need for an improved process for the production of sputtering targets comprising sub-stoichiometric $TiO_2$ which does not involve the hot-pressing and sintering route of JP-A07-233469 and which can be used to produce such targets which have a high enough electrical conductivity to be used as large size targets with complex shapes at high power levels.

We have now surprisingly discovered that titanium dioxide can be D.C. sputtered at high power levels from a target comprising sub-stoichiometric titanium dioxide to provide a coating on a substrate of sub-stoichiometric or stoichiometric titanium dioxide.

Accordingly, the present invention provides a process for the preparation of a sputtering target which comprises sub-stoichiometric titanium dioxide, $TiO_x$, where x is below 2 having an electrical resistivity of less than 0.5 ohm·cm, optionally together with niobium oxide, which process comprises plasma spraying titanium dioxide, $TiO_2$, optionally together with niobium oxide, onto a target base in an atmosphere which is oxygen deficient and which does not contain oxygen-containing compounds, the target base being coated with $TiO_x$ which is solidified by cooling under conditions which prevent the sub-stoichiometric titanium dioxide from combining with oxygen.

Sub-stoichiometric titanium dioxide, $TiO_x$, where x is below 2 and generally is in the range of from 1.55 to 1.95 is known in the art. When produced according to the process of the present invention the electrical conductivity will vary, depending upon the stoichiometry, the most preferred form having an electrical resistivity of 0.02 ohm·cm.

In carrying out the process of the present invention titanium dioxide, $TiO_2$ is plasma sprayed onto a target base, such as a backing tube or plate, for example a target base of an electrically conductive material, for example stainless steel or titanium metal, aluminium or copper. The target may be of any type known in the art, for example a rotatable target or a flat magnetron target.

During the plasma spraying process, the action of the plasma flame on the titanium dioxide causes the titanium dioxide to lose some oxygen atoms from its lattice, preferably from the surface of the particles. The titanium dioxide is converted into the sub-stoichiometric form, i.e. non-stoichiometric oxygen deficient titania. The primary plasma gas used for the plasma spraying is preferably argon, with hydrogen as the secondary plasma gas in order to obtain the highest temperatures of the particles. The titanium dioxide which is subjected to plasma spraying preferably has a particle size in the range of from 1 to 60 micrometres, preferably in the range of from 1 to 70 micrometres. The sub-stoichiometric titanium dioxide which is coated on the target base is solidified under conditions which prevent it from regaining oxygen and reconverting to $TiO_2$. Preferably the target base is water cooled during the plasma spraying in order to quench the titanium dioxide in the sub-stoichiometric form and to improve the conductivity thereof. It is also important to use a certain amount of hydrogen or nitrogen in the plasma gas in order to produce a high temperature plasma and to assist in the reduction. Hydrogen is preferred because of its reducing powers. Preferably particle temperatures of above 2000° C. are used, more preferably above 2500° C.

In a particular embodiment of the present invention, the titanium dioxide may be plasma sprayed together with niobium oxide.

In a further aspect the present invention also provides a process for the preparation of sub-stoichiometric titanium dioxide, $TiO_x$ where x is below 2 having an electrical resistivity of less than 0.1 ohm·cm, which process comprises subjecting titanium dioxide to a plasma treatment in an atmosphere which is oxygen deficient and which does not contain oxygen-containing compounds. In carrying out this process the titanium dioxide is preferably sprayed through a plasma flame, for example a plasma flame using a mixture of argon and hydrogen as the plasma gas. Preferably the plasma flame will operate at a high temperature to raise the temperature of the particles to above 2000° C.

The sputtering targets which are produced according to the process of the invention have a high electrical conductivity and thus are able to run at high power levels using conventional D.C. power supplies, without the need for expensive arc diverter systems, or D.C. switching power supplies, or the Twin-Mag System where two targets are sequentially used as anode and cathode with a mid-frequency power supply, or any special requirements of a gas control system. Using the targets produced according to the present invention, D.C. sputtering can be carried out at power levels of up to 100 Kw. The main consequence is that large target bases, e.g. rotatable 3.5 metres long and 150 mm in diameter can be coated up to a typical coating thickness of 6 mm.

The targets produced by the process of the present invention do not suffer from significant arcing problems because titanium dioxide has a higher melting point than titanium metal for which so called "vapour arcing" is a problem due to the lower melting point of the metal. Even if some arcing does occur for titanium dioxide there is little accompanying damage to the target.

The present invention will be further described with reference to the following Examples.

EXAMPLE 1

A rotatable target, water cooled on the inside to 35° C., comprising a tube of stainless steel of diameter 133 mm and length 800 mm was coated to a thickness of from 4 to 10 mm with sub-stoichiometric titanium dioxide, $TiO_x$, where x is below 2 as hereinbefore described by plasma spraying titanium dioxide (rutile) having a particle size of from 10 to 40 μm onto the target using argon as the primary plasma gas and hydrogen as the secondary plasma gas. 72 litres (60% argon, 40% hydrogen) were used. The power level was 45 kW (455A, 96V).

EXAMPLE 2

A commercial white pigment consisting of titanium dioxide in the anatase crystal form was used. This powder is stoichiometric and electrically insulating. The powder was mechanically agglomerated and compacted into flakes, ground, sieved (70–100 μm) and sintered at 1300° C. in air. The sintered body was then ground and sieved to a particle size of 10–40 μm. The particles were yellow stoichiometric, non-conductive, titanium dioxide with a rutile crystalline structure.

A rotatable target comprising a backing tube of aluminium (2.50 m long and 133 mm diameter) was prepared by plasma spraying of the above rutile powder using argon as the primary gas and hydrogen as the secondary gas. 75 litres (40% argon, 60% hydrogen) were used.

The power level was 50 kW (110V, 455A). The plasma spraying was carried out under a nitrogen atmosphere.

The target was rotated at 100 rpm and the torch translation was 2.5 m/min until a coating 4 mm thick was obtained. The inside of the aluminium tube was water cooled to a temperature of 35° C. The coated target had a resistivity of 0.07 ohm·cm. The target was subsequently tested at power levels of up to 100 kw and worked well in the sputtering equipment without significant arcing. The deposition of titanium dioxide was six times higher than the rate from a titanium metal target in reactive sputtering.

EXAMPLE 3

Example 2 was repeated with a low pressure vacuum plasma operating at 200 mBar using titanium dioxide in the anatase form having a particle size in the range of from 1 to 10 μm. Using the low pressure plasma, powders with a smaller particle size can be used.

On spraying onto a target base under the conditions of Example 2 the anatase was converted into a sub-stoichiometric rutile form of titanium dioxide.

The coated target had a resistivity of 0.02 ohm·cm.

EXAMPLE 4

A mixture of niobium oxide (25 parts by weight) and titanium dioxide (75 parts by weight) having a particle size of from 0.1 to 2 μm was agglomerated and compacted, dried and sintered at 1300° C. in air. The sintered body was then ground to a particle size of 10 to 40 μm.

The powder mixture was then plasma sprayed under the conditions given in Example 2 onto an aluminium backing tube to a coating thickness of 4 mm. The coated target had an electrical resistivity of 0.5 ohm·cm and thus could be used as a D.C. sputtering target.

What is claimed is:

1. A process for the preparation of a sputtering target which comprises sub-stoichiometric titanium dioxide, $TiO_x$, where x is below 2 having an electrical resistivity of less than 0.5 ohm·cm, optionally together with niobium oxide, which process comprises plasma spraying titanium dioxide, $TiO_2$, optionally together with niobium oxide, onto a target base in an atmosphere which is oxygen deficient and which does not contain oxygen-containing compounds, the target base being coated with $TiO_x$ which is solidified by cooling under conditions which prevent the sub-stoichiometric titanium dioxide from combining with oxygen.

2. A process as claimed in claim 1 wherein the target base is water cooled during the plasma spraying.

3. A process as claimed in claim 1 wherein the plasma spraying is carried out using argon as a plasma gas and hydrogen as a secondary plasma gas.

4. A process as claimed in claim 1 wherein the target base is titanium, stainless steel, aluminium or copper.

5. A process as claimed in claim 4 wherein the target base is a rotatable target or a flat magnetron target.

6. A process as claimed in claim 1 wherein the titanium dioxide which is plasma sprayed has particle size in the range of from 1 to 60 micrometres.

7. A process as claimed in claim 1 wherein the titanium dioxide is plasma sprayed together with $Nb_2O_3$.

8. A process as claimed in claim 1 wherein the sub-stoichiometric titanium dioxide, $TiO_x$, has a value of x in the range of from 1.55 to 1.95.

9. A process as claimed in claim 1 wherein the sputtering target has an electrical resistivity of about 0.02 ohm·cm.

10. A process for the preparation of sub-stoichiometric titanium dioxide, $TiO_x$, where x is below 2 having an electrical resistivity of less than 0.1 ohm·cm which process comprises subjecting titanium dioxide to a plasma treatment in an atmosphere which is oxygen deficient and which does not contain any oxygen-containing compounds.

11. A process as claimed in claim 10 wherein the titanium dioxide is sprayed through a plasma flame having a temperature of above 2000° C.

12. A process as claimed in claim 11 wherein the plasma flame uses a mixture of hydrogen and argon as a plasma gas.

* * * * *